United States Patent [19]
Kouge et al.

[11] Patent Number: 5,399,596
[45] Date of Patent: Mar. 21, 1995

[54] POLYFLUORIDE SULFONIUM COMPOUNDS AND POLYMERIZATION INITIATOR THEREOF

[75] Inventors: Katsushige Kouge; Tatsuya Koizumi, all of Yamaguchi; Takeshi Endo, Kanagawa, all of Japan

[73] Assignee: Sanshin Kagaku Kogyo Co., Ltd., Yamaguchi, Japan

[21] Appl. No.: 102,498

[22] Filed: Aug. 5, 1993

Related U.S. Application Data

[63] Continuation of Ser. No. 953,285, Sep. 30, 1992, abandoned, which is a continuation of Ser. No. 317,959, Mar. 2, 1989, abandoned.

[30] Foreign Application Priority Data

| | | |
|---|---|---|
| Mar. 3, 1988 | [JP] Japan | 63-51236 |
| Mar. 15, 1988 | [JP] Japan | 63-62790 |
| Oct. 27, 1988 | [JP] Japan | 63-272757 |
| Jan. 7, 1989 | [JP] Japan | 1-1563 |
| Jan. 12, 1989 | [JP] Japan | 1-4231 |

[51] Int. Cl.$^6$ .......................... C08F 2/46
[52] U.S. Cl. .......................... 522/31; 556/64
[58] Field of Search .......................... 522/31; 556/64

[56] References Cited

U.S. PATENT DOCUMENTS

| | | | |
|---|---|---|---|
| 3,283,010 | 11/1966 | Lloyd et al. | 564/282 |
| 3,565,861 | 2/1971 | White et al. | 564/282 |
| 3,981,897 | 9/1976 | Crivello | 260/440 |
| 4,034,046 | 7/1977 | Lamberti et al. | 564/282 |
| 4,058,400 | 11/1977 | Crivello | 96/86 P |
| 4,058,401 | 11/1977 | Crivello | 96/115 R |
| 4,069,055 | 1/1978 | Crivello | 96/115 R |
| 4,069,056 | 1/1978 | Crivello | 96/115 P |
| 4,136,102 | 1/1979 | Crivello | 260/440 |
| 4,150,988 | 4/1979 | Crivello | 96/35.1 |
| 4,161,405 | 7/1979 | Crivello | 96/35.1 |
| 4,161,478 | 7/1979 | Crivello | 260/327 B |
| 4,173,551 | 11/1979 | Crivello | 260/18 EP |
| 4,175,963 | 11/1979 | Crivello | 430/296 |
| 4,175,972 | 11/1979 | Crivello | 204/159.18 |
| 4,175,973 | 11/1979 | Crivello | 204/159.14 |
| 4,192,924 | 3/1980 | Crivello | 521/126 |
| 4,216,288 | 8/1980 | Crivello | 430/280 |
| 4,219,654 | 8/1980 | Crivello | 546/342 |
| 4,225,691 | 9/1980 | Crivello | 526/192 |
| 4,230,814 | 10/1980 | Crivello | 526/333 |
| 4,234,732 | 11/1980 | Crivello | 546/174 |
| 4,238,587 | 12/1980 | Crivello | 526/192 |
| 4,239,725 | 12/1980 | Crivello | 264/328.6 |
| 4,241,204 | 12/1980 | Crivello | 526/333 |
| 4,245,029 | 1/1981 | Crivello | 430/280 |
| 4,250,311 | 2/1981 | Crivello | 546/9 |
| 4,259,454 | 3/1981 | Crivello | 521/113 |
| 4,273,668 | 6/1981 | Crivello | 252/182 |
| 4,283,312 | 8/1981 | Crivello | 260/18 EP |
| 4,310,469 | 1/1982 | Crivello | 260/446 |
| 4,329,306 | 5/1982 | Crivello | 264/137 |
| 4,336,363 | 6/1982 | Crivello | 526/333 |
| 4,407,759 | 10/1983 | Crivello | 260/440 |
| 4,417,061 | 11/1983 | Crivello | 549/3 |
| 4,933,377 | 6/1990 | Saeva | 522/31 |

FOREIGN PATENT DOCUMENTS

| | | |
|---|---|---|
| 0331496 | 9/1989 | European Pat. Off. |
| 50-029511 | 3/1975 | Japan |
| 50-151997 | 12/1975 | Japan |
| 54-53181 | 4/1979 | Japan |
| 56-152833 | 11/1981 | Japan |
| 58-37003 | 3/1983 | Japan |
| 60-188425 | 9/1985 | Japan |
| 63-223002 | 9/1988 | Japan |
| 1526923 | 10/1978 | United Kingdom |

OTHER PUBLICATIONS

Crivello "Cationic Polymerization–Iodonium And Sulfonium Salt Photo–Initiators", Advances In Polymer Science 62; Springer–Verlag, Berlin, 1984. pp. 1,2,27,28,29,30,31,33,34,37.

Primary Examiner—Marion E. McCamish
Assistant Examiner—Mark A. Chapman
Attorney, Agent, or Firm—Sandler, Greenblum & Bernstein

[57] ABSTRACT

The oxyphenylbenzylalkyl sulfonium polyfluoro(sub)-metal salts are novel compounds, which can be produced by way of an anion exchanging process, which compounds have an effect as an initiator capable of polymerizing cationically polymerizable material such as an epoxy monomer or styrene monomers by means of radiation rays such as light or electron rays and/or heat in a short period of time.

12 Claims, 2 Drawing Sheets

F I G. 1
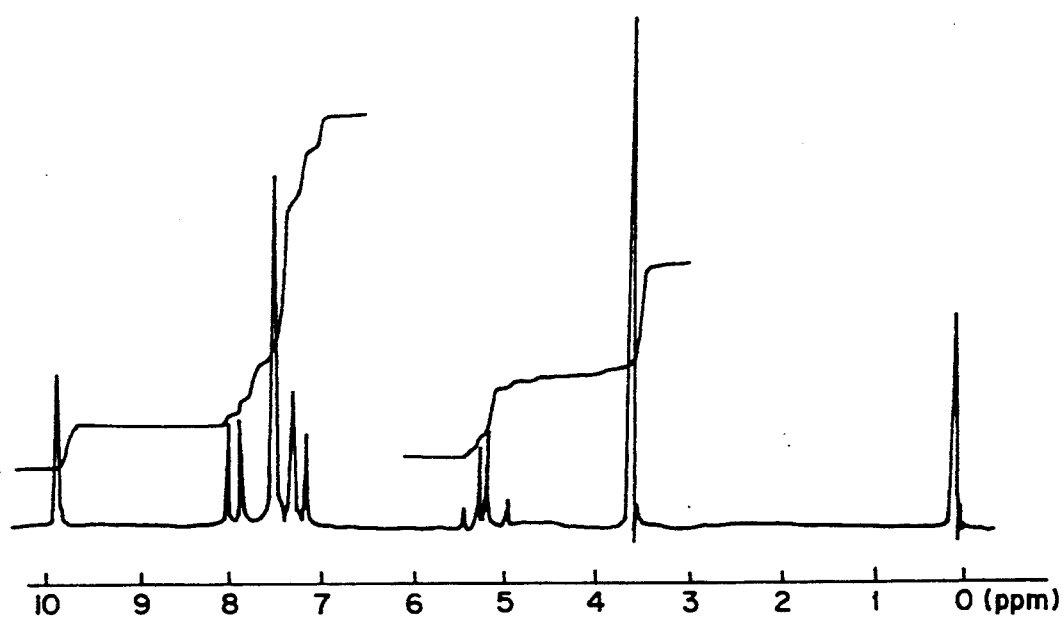
F I G. 2
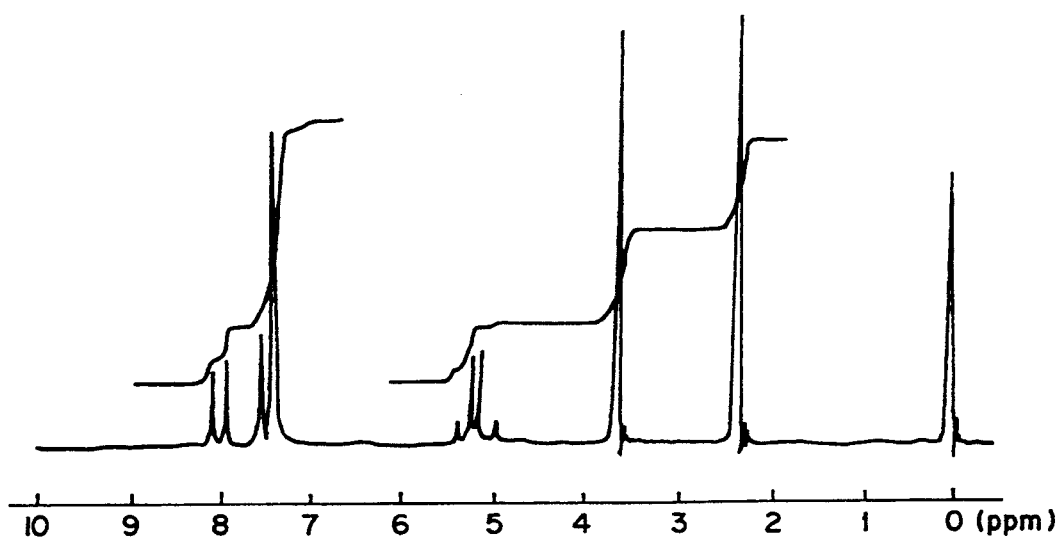

POLYFLUORIDE SULFONIUM COMPOUNDS AND POLYMERIZATION INITIATOR THEREOF

This application is a continuation of application Ser. No. 07/953,285, filed Sep. 30, 1992, now abandoned, which is a Continuation of U.S. Ser. No. 07/317,959, filed Mar. 2, 1989, now abandoned.

BACKGROUND OF THE INVENTION

1. Field of the Invention

The present invention concerns novel polyfluoride sulfonium compounds, a process for producing thereof, a cationically polymerizable composition containing the polyfluoride sulfonium compounds, a polymerization initiator comprising the polyfluoride sulfonium compounds as the main ingredient and a polymerization process using the polymerization initiator. More specifically, the present invention relates to a cationically polymerizable composition containing a novel polyfluoride sulfonium compound useful for obtaining a curing product having satisfactory property or an oligomer of a cationically polymerizable vinyl compound having practical usefulness by polymerizing the cationically polymerizable material in a short period of time by means of heat or radiation rays such as light or electron rays, a polymerization initiator for such polymerization and a polymerization process.

2. Discussion of Background and Material Information

Generally, cationically polymerizable materials, which have used epoxy resins have been employed for various applications requiring materials of high performance. This is particularly so where the method of curing by polymerization under the irradiation of radiation rays at predetermined wave length, such as ultraviolet rays, can provide curing within a short period of time by a simple polymerization step.

Epoxy resins have so far been used generally in the form of a two-component system by incorporating an active amine-containing compound or a carboxylic acid anhydride as a curing agent. However, the two-component system using such a curing agent involves a drawback that the ingredients have to be mixed completely and it needs curing times as long as several hours.

In addition, there is also known a boron trifluoridemonoethyl amine system for curing the epoxy resin in a one component system but it takes from 1 to 8 hours even at high temperatures of 160° C. or higher. As an improvement there can be mentioned U.S. Pat. No. 3,565,861 even though this patent also requires high temperature. Accordingly, these compositions can not be used for the coating of heat sensitive electronic parts, and other applications which cannot tolerate high temperatures. Further, in the case of curing an epoxy resin by light, there has been proposed a method of using a aryl diazonium metal polyhalide complex. However, polymerization takes place rapidly and premature gelation tends to occur in this method. In addition, such compositions cannot be stored satisfactorily even for a short period of time in a dark place. In view of the above, it has been proposed to suppress the premature gelation of the composition and provide storage-stability in a dark place for epoxy material containing a aryl diazonium metal polyhalide complex. However, since nitrogen is released during curing from such a composition, the resultant curing material involves a problem of incorporating bubbles in the product, which increases costs and causes completely unsatisfactory results.

Various photodegrading sulfonium salts have been known for the onium salt. For instance, it has been known to use p-hydroxyphenyldimethylsulfonium hexafluorarsenates as a photocuring agent in Japanese Patent Publication No. Sho 54-53181 and phenylsulfonium salt as a photocuring agent for epoxy resins in Japanese Patent Publication No. Sho 50-151997. However, although such onium salts can photocure epoxy resins, epoxy resins can not be cured by merely applying heat.

On the other hand, as the thermal latent type catalysts capable of activating onium salts by applying heat thereby curing epoxy resins, there have been reported benzylsulfonium salt, for example, dialkylbenzylsulfonium hexafluoroantimonate in Japanese Patent Publication Nos. Sho 58-37003 and Sho 63-223002 and a trialkylsulfonium salt in Japanese Patent Publication No. Sho 56-152833. However, these sulfonium salts are inert to light and cannot cure epoxy resins in a short period of time. They also require temperatures, for example, of 150° C. or higher, and can not be said to be practical in view of the heating time and temperature.

Further, Japanese Patent Publication No. 60-188425 discloses a curing agent for the heat polymerization of special esters such as spiro type esters.

On the other hand, as the cationic polymerization initiator for cationically polymerizable vinyl compounds, there have been known Lewis acid catalysts such as mineral acid, $BF_3$, $ZnCl_2$, $AlCl_3$ and halogen-containing organic aluminum compounds such as $AlR_2Cl$ and $AlRCl_2$. These catalysts, however, cause a violent cationic polymerization reaction at a temperature of 0° C. or higher which reaction can not be controlled as desired, and the polymerization degree can not be increased. It is of course impossible to previously formulate a cationically polymerizable monomer and such a catalyst into a one component system at room temperature which can be stored.

For polymerizing a vinyl compound, it has been generally necessary to control the chain transfer reaction or to stop the reaction. Accordingly, the polymerization reaction has usually been conducted by charging a catalyst solution into the system after cooling a cationically polymerizable monomer dissolved in an appropriate solvent to predetermined extremely low temperatures. However, for conducting the polymerization reaction on an commercial basis an extremely low temperature (for instance from −130° C. to −40° C.) is employed. This makes the operation complicated and increases the cooling cost and, accordingly, it is not satisfactory. Although U.S. Pat. No. 3,283,010 describes the release of benzyl cations, polymerization of the polymer is not intended.

Besides the foregoing citations, p-hydroxyphenyl benzylsulfonium compound is disclosed in Japanese Patent Publication Sho 50-29511 and p-hydroxyphenyl-benzylsulfonium halide is disclosed in U.S. Pat. No. 4,034,046. However, (sub)metalpolyfluorides of a substituted or non-substituted oxyphenylbenzylalkylsulfonium compound has not yet been known.

BRIEF DESCRIPTION OF THE DRAWINGS

FIG. 1 is a $^1$H-NMR spectrum chart for the compound synthesized in Synthetic Example 1.

FIG. 2 is $^1$H-NMR spectrum chart for the compound synthesized in Synthetic Example 11;

SUMMARY OF THE INVENTION

Figure 3:
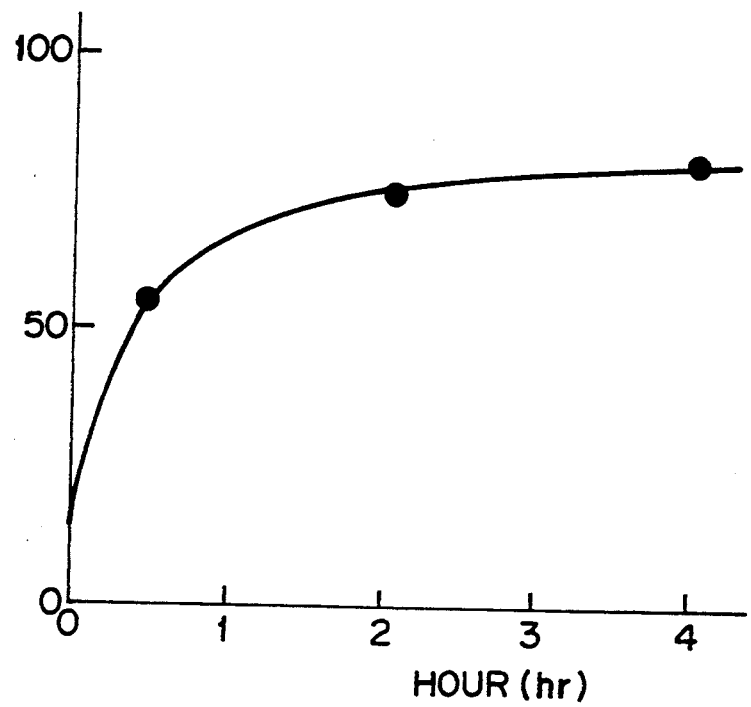
FIG. 3 is a graph illustrating the conversion ratio of phenyl glycidyl ether by means of a benzylsulfonium salt according to the present invention by heat polymerization in Working Example 1.

The present invention provides a novel polyfluoride sulfonium compound, process for producing thereof, a cationically polymerizable composition containing the novel polyfluoride sulfonium compound and polymerization initiator containing same which is capable of polymerizing cationically polymerizable material such as epoxy resins in a short period of time under the irradiation of heat or radiation rays such as light or electron rays. An excellent storage stable product is prepared which has utility as a sealant and matrix resin for composite material.

The present invention also provides a monomer composition capable of polymerizing a cationically polymerizable vinyl compound, such as styrene monomer, which has excellent storage stability as a mixture with the polymerization initiator. This system is commercially useful to provide an oligomer of the vinyl compound and provides a polymerization process therefor and a polymerization initiator as a novel compound.

More particularly the present invention provides a novel sulfonium compound represented by the general formula (I):

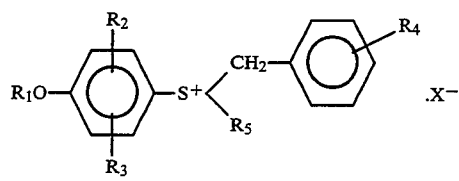

where $R_1$ represents a member selected from the group consisting of hydrogen, a methyl group, an acetyl group, and a methoxycarbonyl group, $R_2$ and $R_3$ each represent a member selected from the group consisting of hydrogen, a halogen group and an alkyl group having 1 to 4 carbon atoms, $R_4$ represents a member selected from the group consisting of hydrogen, a halogen group, a methyl group and a methoxy group, $R_5$ represents an alkyl group having 1 to 4 carbon atoms, and $X^-$ represents a member selected from the group consisting of $SbF_6$, $PF_6$, $AsF_6$ and $BF_4$.

In another embodiment, the invention involves a process for producing a sulfonium compound as defined above wherein the sulfonium compound represented by the general formula (I) is produced by reacting a sulfonium compound represented by the following general formula (II) with a member selected from the group consisting of $MSbF_6$, $MPF_6$, $MAsF_6$ or $MBF_4$ in which M represents an alkali metal salt, by using, as a reaction solvent one or more of hydrous or anhydrous solvents selected from the group consisting of methanol, acetone, ethyl acetate, ethanol and acetonitrile,

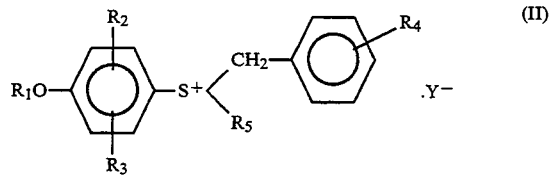

where $R_1$ represents a member selected from the group consisting of hydrogen, a methyl group, an acetyl group, and a methoxycarbonyl group; $R_2$ and $R_3$ each represent a member selected from the group consisting of hydrogen, a halogen group, an alkyl group having 1 to 4 carbon atoms; $R_4$ represents a member selected from the group consisting of hydrogen, a halogen group, a methyl group and a methoxy group; $R_5$ represents an alkyl group having 1 to 4 carbon atoms and $Y^-$ represents an anion member selected from the group consisting of chlorine, and methylsulfate.

The invention also involves a process for producing a sulfonium compound represented by the general formula (IV), wherein a sulfonium compound represented by the following general formula (III) and a halide represented by $R_1$-Z are reacted under the presence of a base in acetonitrile and/or acetic acid ester;

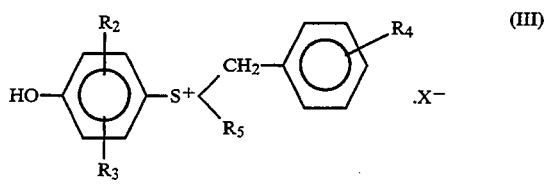

where $R_2$ and $R_3$ each represent a member selected from the group consisting of hydrogen, a halogen group and an alkyl group having 1 to 4 carbon atoms; $R_4$ represents a member selected from the group consisting of hydrogen, a halogen group, a methyl group and a methoxy group; $R_5$ represents an alkyl group having 1 to 4 carbon atoms; $X^-$ represents a member selected from the group consisting of $SbF_6$, $PF_6$, $AsF_6$ and $BF_4$; and Z represents a halogen group:

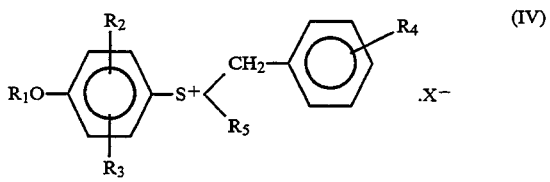

where $R_1$ represents a member selected from the group consisting of a methyl group, an acetyl group and a methoxycarbonyl .group; and $R_2$-$R_5$ and $X^-$ have the same meanings as those in the general formula (III). And optionally, wherein the base is selected from a member selected from the group consisting of triethylamine, trimethylamine, dicyclohexylamine and N-methylmorpholine.

The invention also involves a polymerizable composition containing one or more cationically polymerizable materials and the benzyl sulfonium salt represented by the general formula (I). And, wherein the cationically polymerizable material is a compound having an epoxy group, a cationically polymerizable vinyl compound and/or a compound having one or more of spiro-orthoester group, bicyclo-ortho ester group and spiro-orthocarbonate group.

Another feature of the invention involves a polymerization initiator for cationically polymerizable material comprising, as the main component, a benzyl sulfonium salt represented by the general formula (I) and a process of polymerizing cationically polymerizable material, wherein one or more of benzyl sulfonium salts represented by the general formula (I) is added, as a polymerization initiator, to one or more of cationically polymerizable materials and wherein the polymerization reaction is started by radiation rays, by heat and combinations thereof. And wherein the radiation rays are ultraviolet rays and/or wherein the polymerization is conducted at a temperature of 20° C. or higher and the polymerizable material is a vinyl compound.

DETAILED DESCRIPTION OF THE INVENTION

As described, the present invention comprises essentially (sub)metalpolyfluorides of a substituted or non-substituted oxyphenyl or substituted or non-substituted benzylalkylsulfonium compounds. The present compounds may be synthesized by using a corresponding sulfonium chloride or sulfonium methylsulfate as the starting material and reacting it with an alkali metal salt of a predetermined acid, for example, $NaSbF_6$, $KSbF_6$, $NaBF_4$, $LiBF_4$, $NaPF_6$, $KPF_6$, $NaAsF_6$ or $KAsF_6$ in a predetermined anhydrous or hydrous organic solvent. The organic solvent used may be selected from a wide range of solvents including methanol, acetone, ethyl acetate, ethanol and acetonitrile. Other solvents than described above, for example, benzene or toluene cause no reaction since they do not substantially dissolve the inorganic salt. Further, although DMF or DMSO can produce the reaction due to their solubility, they are difficult to be removed from the reaction system owing to their high boiling point.

As an alternate synthesis method for obtaining a substituted oxyphenyl benzylalkyl sulfonium compound, the hydroxy group of a hydrox phenyl benzylalkyl sulfonium compound can be reacted with an acid halide such as chloromethyl carbonate, acetyl chloride or acetyl iodide in the presence of base.

The reaction solvent in this method includes ethyl acetate and acetonitrile. Other solvents can not provide preferred result. For instance, protonic solvents such as water, methanol or ethanol react with acid halide. Aromatic solvents typically represented by benzene do not dissolve the product and, accordingly, reduce the purity thereof. Polar solvents typically represented by NN-dimethyl formamide (DMF) or dimethylsulfoxide (DMSO) can provide reaction, but it is difficult to remove them from the reaction system due to their high boiling point, causing for example, decomposition of products during removal. The reaction temperature is preferably about 20° C. or lower, and preferably, 5° C. or lower for avoiding the decomposition of the product. The base is preferably triethylamine, trimethylamine, dicyclohexylamine, N-methylmorpholine, and similar materials which may be used alone or as a mixture of two or more of them.

The polymerization initiator according to the present invention comprises a paired compound of a(substituted or non-substituted)-benzyl-4-(substituted or non-substituted)-oxyphenyl sulfonium compound represented by the general formula (I) and a predetermined anion as the constituent factor.

The cationically polymerizable material used in the present invention is an acid polymerizable or acid curable material and epoxy resins are particularly preferred. Examples of suitable material are epoxide monomers, episulfide monomers; polyepoxides (or epoxy resin); polyepisulfides (or episulfide resins); phenol/formaldehyde resins; melamine/formaldehyde resins; urea/formaldehyde resins, cyclic ether and thiocyclic ethers such as spiro-orthoester, bicyclo-orthoester and spiro-ortho carbonate and polymers thereof; lactone, styrene, vinyl ether and vinyl thioether, as well as those resins containing a crosslinker for crosslinking or curing resins when treated with acid, which may be used alone or as a mixture of two or more of them.

Preferred benzylsulfonium salt compounds which are used as the polymerization initiator in the present invention can include, for example, benzyl-4-hydroxyphenylmethylsulfonium hexafluoroantimonate.

benzyl-4-hydroxyphenylmethylsulfonium hexafluorophosphate.

benzyl-4-hydroxyphenylmethylsulfonium hexafluoroarsenate.

benzyl-4-hydroxyphenylmethylsulfonium tetrafluoroborate.

benzyl-4-methoxyphenylmethylsulfonium hexafluoroantimonate.

benzyl-4-methoxyphenylmethylsulfonium hexafluorophosphate.

benzyl-4-methoxyphenylmethylsulfonium hexafluoroarsenate.

benzyl-4-methoxyphenylmethylsulfonium tetrafluoroborate.

4-acetoxyphenylbenzylmethylsulfonium hexafluoroantimonate.

4-acetoxyphenylbenzylmethylsulfonium hexafluorophosphate.

4-acetoxyphenylbenzylmethylsulfonium hexafluoroarsenate.

4-acetoxyphenylbenzylmethylsulfonium tetrafluoroborate.

benzyl-2-methyl-4-hydroxyphenylmethylsulfonium hexafluoroantimonate.

benzyl-2-methyl-4-hydroxyphenylmethylsulfonium hexafluorophosphate.

benzyl-2-methyl-4-hydroxyphenylmethylsulfonium hexafluoroarsenate.

benzyl-2-methyl-4-hydroxyphenylmethylsulfonium tetrafluoroborate.

benzyl-3-chloro-4-hydroxyphenylmethylsulfonium hexafluoroantimonate.

benzyl-3-chloro-4-hydroxyphenylmethylsulfonium hexafluorophosphate.

benzyl-3-chloro-4-hydroxyphenylmethylsulfonium hexafluoroarsenate.

benzyl-3-chloro-4-hydroxyphenylmethylsulfonium tetrafluoroborate.

benzyl-3-methyl-4-hydroxy-5-tert-butylphenylmethylsulfonium hexafluoroantimonate.

benzyl-3-methyl-4-hydroxy-5-tert-butylphenylmethylsulfonium hexafluorophosphate.

benzyl-3-methyl-4-hydroxy-5-tert-butylphenylmethylsulfonium hexafluoroarsenate.

benzyl-3-methyl-4-hydroxy-5-tert-butylphenylmethylsulfonium tetrafluoroborate.

4-methoxybenzyl-4-hydroxyphenylmethylsulfonium hexafluoroantimonate.
4-methoxybenzyl-4-hydroxyphenylmethylsulfonium hexafluorophosphate.
4-methoxybenzyl-4-hydroxyphenylmethylsulfonium hexafluoroarsenate.
4-methoxybenzyl-4-hydroxyphenylmethylsulfonium tetrafluoroborate.
benzylethyl-4-hydroxyphenylsulfonium hexafluoroantimonate.
benzylethyl-4-hydroxyphenylsulfonium hexafluorophosphate.
benzylethyl-4-hydroxyphenylsulfonium hexafluoroarsenate.
benzylethyl-4-hydroxyphenylsulfonium tetrafluoroborate.
benzyl-3-methyl-4-hydroxyphenylmethylsulfonium hexafluoroantimonate.
benzyl-3-methyl-4-hydroxyphenylmethylsulfonium hexafluorophosphate.
benzyl-3-methyl-4-hydroxyphenylmethylsulfonium hexafluoroarsenate.
benzyl-3-methyl-4-hydroxyphenylmethylsulfonium tetrafluoroborate.
benzyl-4-methoxycarbonyloxyphenylmethylsulfonium hexafluoroantimonate.
benzyl-4-methoxycarbonyloxyphenylmethylsulfonium hexafluorophosphate.
benzyl-4-methoxycarbonyloxyphenylmethylsulfonium hexafluoroarsenate.
benzyl-4-methoxycarbonyloxyphenylmethylsulfonium tetrafluoroborate.

The benzylsulfonium salts used in the present invention have an increased activity to heat, as well as have an activity to radiation rays such as light or electron rays. That is, it is considered that such benzylsulfonium salts are excited by heat or radiation rays to release the benzyl cations thereby proceeding the polymerization of the cationically polymerizable material described above.

Further in the present invention, in a case where the cationically polymerizable material is a vinyl compound, solution polymerization is usually conducted by using a solvent inert to the initiator or the monomer upon the polymerization reaction, but bulk polymerization is also employed. As the solution usable herein, there can be mentioned, for example, aromatic hydrocarbons such as toluene, benzene and xylene; aliphatic hydrocarbons such as n-hexane and n-heptane; cycloaliphatic hydrocarbons such as cyclohexane; hydrocarbon mixtures such as petroleum ether and ligroin; and halogenated hydrocarbons such as chlorobenzene and dichloroethane. The polymerizing reaction for the vinyl compounds is conducted under normal or elevated pressure at a reaction temperature of about 20° C. or higher, preferably, from about 60° to about 150° C. at which heating can easily be conducted commercially.

Further, since the sulfonium salt used as the polymerization initiator in the present invention does not start the cation polymerizing at room temperature, it is also possible, if required, to preform the monomer and the catalyst previously into a one component system by using an appropriate solvent and then store them.

The benzylsulfonium salt used in the present invention is used from about 0.01 to about 20 parts by weight, preferably, from about 0.1 to about 5 parts by weight based on 100 parts by weight of the resin. If amounts are used that are less than about 0.01 parts by weight, no sufficient polymer can be obtained. With an additional amount in excess of about 20 parts by weight, no preferred products can be obtained in view of the physical property after the polymerization. It is also not preferred in view of the excess cost involved. Further, polymerizing and curing is conducted by treatment with radiation rays or heat and, if required, heating and irradiation with radiation rays may be used in combination. Further, a solvent may be used, if required, upon polymerization.

As the radiation rays in the present invention, ultraviolet rays at a wavelength within a broad range may be used with from 250 to 400 nm being preferred. Accordingly, sources in such range may be derived from low pressure mercury lamp, medium pressure mercury lamp, high pressure mercury lamp, xenone lamp, carbon arc lamp, and so forth as the light source. Further polymerization/curing may be conducted by the irradiation of electron rays.

The composition according to the present invention may be used, depending on the case, in admixture with auxiliary agents typically represented by extenders, flame retardants, antistatic agents, surface active agents and acid anhydrides, such as phthalic anhydride. The composition may be used for lustering varnish, ink, paint, adhesive, laminated board, pre-preg, molding material, sealing material, and so forth. The term "pre-preg" refers to a common type forming material with a non-adhesive semi-soften state such as a thermoplastic synthetic resin for using fiber reinforced plastic so that the term is a general description of such synthetic resin under semi-softened state before hot press-forming with a fiber cloth.

The curable composition according to the present invention can be stored for a long period of time and has a function of rapidly starting the polymerization reaction under the irradiation of radiation rays such as light or electron rays. The reaction may also be started by heating at a temperature of 150° C. or lower, as well as by the combined use of heating and radiation treatment. It can provide cured products of excellent curability at high temperature, with no hygroscopic property which are excellent in water proofness, chemical resistance and electrical properties.

Further, the cationically polymerizable vinyl compound composition has a feature capable of storing the monomer and the catalyst in one component system which has been difficult to do so far, while enabling cationic polymerization at a temperature of 20° C. or higher to obtain a polymer having a high polymerization degree of practical usefulness by simple heating.

The present invention is to be further described referring to preferred embodiments but it should be noted that the invention is not to be limited to the following examples. Such examples are given to illustrate the invention. All percentages given throughout the specification are based on weight unless otherwise indicated.

EXAMPLES DEMONSTRATING SYNTHESIS OF POLYFLUOROSULFONIUM COMPOUNDS

EXAMPLE 1

Synthesis for benzyl-4-hydroxphenylmethylsulfonium hexafluoroantimonate

Benzyl-4-hydroxyphenylmethyl sulfonium chloride, in an amount of 26.6 g (0.1 mol), was dissolved into 640 ml of methanol, to which 27.5 g (0.1 mol) of powdery $KSbF_6$ was added under stirring and then were stirred further for one hour. The reaction solution was concentrated under a reduced pressure and the residue was extracted with ethyl acetate. The ethyl acetate layer was washed with water, dried and then concentrated. 39.6 g (85.0 % yield) of benzyl-4-hydroxyphenylmethylsulfonium hexafluoroantimonate was obtained as white crystals from the residue.
Melting point 114.0°–116.0° C.
1R (KBr) cm$^{-1}$ 3400, 660
(Acetone-d 6) ppm
δ=3.50 (3H, S, CH$_3$ —)
δ=5.12 (2H, d d, J=16HZ, 12HZ, C$_6$H$_5$CH$_2$ —)
δ=7.12 (2H, d, J=9HZ)
7.85 (2H, d, J=9HZ) or more ( 4H, —C$_6$H$_4$ —)
δ=7.42 (5H, S, C$_6$H$_5$ —)
δ=9.81 (1H, S, HO —)
Elementary Analysis: C$_{14}$H$_{15}$OSSbF$_6$
Theoretical Value: C; 36.00%, H; 3.21%
Measured Value: C;36.05%, H; 3.18%

EXAMPLE 2

Synthesis for benzyl-4-hydroxyphenylmethylsulfonium hexafluorophosphate

Benzyl-4-hydroxphenylmethylsulfonium chloride, in an amount of 40 g ( 0.15 mol ), was dissolved into a mixed solution of 360 ml of methanol and 100 ml of water, to which an aqueous solution of 27.6g (0.15 mol) of KPF$_6$ was added under stirring. Subsequently, the same procedures as those in Example 1 were repeated to obtain 48.5g (86.0% yield) of benzyl-4-hydroxyphenylmethylsulfonium hexafluorophosphate as white crystals.
Melting point 138.0°–140.0° C.
1R (K Br) cm$^{-1}$ 3400, 850
N M R (Acetone-d 6)ppm
δ=3.43 (3 H, S, CH$_8$ —)
δ=5.02 (2H, dd, J=16Hz, 12Hz, C$_6$H$_5$CH$_2$ —)
δ=7.05 (2H, d, J=9Hz)
7.75 (2H, d, J=9Hz) or more (4H, —C$_6$H$_4$ —)
δ=7.34 (5H, S, C$_6$H$_5$ —)
Elementary analysis: C$_{14}$H$_{15}$OSPF$_6$
Theoretical value: C; 44.70%, H; 3.99%
Measured value: C; 44.67%, H; 4.04

EXAMPLE 3

Synthesis for benzyl-4-hydroxphenylmethylsulfonium tetafluoroborate

Benzyl-4-hydroxyphenylmethylsulfonium chloride, in an amount of 40g (0.15 mol), was dissolved into a mixed solution of 300 ml of methanol and 200 ml of water, to which 17.0 g (0.15 mol) of powdery NaBF$_4$ was added under stirring. The same procedures as those in Example 1 were repeated to obtain 42.3 g (80.0 % yield) of benzyl-4-hydroxyphenylmethylsulfonium tetfluroborate as white crystals.
Melting point 137.0°–138.0° C.
1R (K Br) cm$^{-1}$ 3400, 1090
NMR (Acetone-d 6)ppm
δ=3.40 (3H, S, CH$_3$ —)
δ=5.05 (2H, d d, J=16HZ, 12HZ, C$_6$H$_5$CH$_2$ —)
δ=7.05 (2H, d, J=9Hz)
7.74 (2H, d, J=9HZ) or more (4H, —C$_6$H$_4$—)
δ=7.30 (5H, S, C$_6$H$_5$ —)
δ=9.52 (1H, S, HO—)
Elementary analysis: C$_{14}$H$_{15}$OSBF$_4$
Theoretical value: C; 52.80%, H; 4.75%
Measured value: C; 52.87%, H; 4.83%

EXAMPLE 4

Synthesis for benzylethyl-4-hydroxyphenylsulfonium hexafluoroantimonate

Benzylethyl-4-hydroxyphenylsulfonium chloride, in an amount of 3g (0.01 mol), was dissolved into 80 ml of methanol, to which 2.95 g (0.01 mol) of powdery KSbF$_6$ was added under stirring. The same procedures as those in Example 1 were repeated to obtain 42.3 g (80.0 % yield) of benzylethyl-4-hydroxyphenylsulfonium hexafluoroantimonate as white crystals.
Melting point 90.0°–93.0° C.
1R (KBr) cm$^{-1}$ 3400, 660
NMR (Acetone-d 6) ppm
δ=1.43 (3H, t, J=7Hz, CH$_3$CH$_2$ —)
δ=3.91 (2H, d d, J=15Hz, 7Hz, CH$_3$CH$_2$ —)
δ=5.11 (2H, d d, J=16Hz, 12Hz, C$_6$H$_5$CH$_2$ —)
δ=7.13 (2H, d, J=9 H z)
δ=7.82 (2H, d, J=9 H z) or more (4H, —C$_6$H$_4$ —)
δ=7.36 (5H, S, C$_6$H$_5$ —)
δ=9.78 (1H, S, HO —)
Elementary analysis: C$_{15}$H$_{17}$OSSbF$_6$
Theoretical value: C; 37.42%, H; 3.54%
Measured value: C; 37.22%, H; 3.49%

EXAMPLE 5

Synthesis for benzylethyl-4-hydroxyphenylsulfonium hexafluorophosphate

Benzylethyl-4-hydroxyphenylsulfonium chloride, in an amount of 1.0 g (0.0035 mol), was dissolved into 10 ml of methanol, to which an aqueous solution of 0.67 g (0.0036 mol) of KPF$_6$ was added under stirring. The same procedures as those in Example 1 were repeated to obtain 0.97 g (70.0 % yield) of benzylethyl-4-hydroxyphenylsulfonium hexafluorophosphate as white crystals.
Melting point 111.0°–115.0° C.
1 R (K Br) cm$^{-1}$ 3450, 850
NMR (Acetone-d 6) ppm
δ=1.39 (3H, t, J=7Hz, CH$_3$CH$_2$ —)
δ=3.87 (2H, dd, J=15Hz, 7Hz, CH$_3$CH2 —)
δ=5.04 (2H, dd, J=16Hz, 12Hz, C$_6$H$_5$CH$_2$ —)
δ=7.04 (2H, d, J=9Hz)
7.75 (2H, d, J=9Hz) or more (4H, —C$_6$H$_4$ —)
δ=7.29 (1H, S, C$_6$H$_5$ —)
Elementary Analysis: C$_{15}$H$_{17}$OSPF$_8$
Theoretical Value: C; 46.15%, H; 4.36%
Measured Value: C; 45.95%, H; 4.40%

EXAMPLE 6

Synthesis for benzylethyl-4-hydroxyphenylsulfonium tetrafluoroborate

Benzylethyl-4-hydroxyphenylsulfonium chloride, in an amount of 5 g (0.018 mol), was dissolved into 50 ml of methanol, to which 2 g (0.018 mol) of powder NaBF$_4$ was added under stirring. The same procedures as those used in Example 1 were repeated to obtain 4.08 g (68.0% yield) of benzylethyl-4-hydroxyphenylsulfonium tetrafluoroborate as white crystals.
Melting point 93.0°–96.0° C.
1 R (K Br) cm$^{-1}$ 3450, 1090
NMR (Acetone-d 6) ppm
δ=1.35 (3H, t, J=7Hz, CH$_3$CH$_2$ —)
δ=3.88 (2H, dd, J=15Hz, 7Hz, CH$_3$CH$_2$ —)
δ=5.10 (2H, dd, J=16Hz, 12Hz, C$_6$H$_5$CH$_2$ —)

δ=7.08 (2H, d, J=9Hz)
7.78 (2H, d, J=9Hz) or more (4H, —C$_6$H$_4$—)
δ=7.32 (5H, S, C$_6$H$_5$—)
δ=9.60 (1H, s, HO—)
Elementary Analysis: C$_{15}$H$_{17}$OSBF$_4$
Theoretical Value: C; 54.24%. H; 5.16%
Measured Value: C; 54.04%. H; 5.22%

EXAMPLE 7

Synthesis for benzyl-4-methoxyphenylmethylsulfonium hexafluoroantimonate

Benzyl-4-methoxyphenylmethylsulfonium chloride, in an amount of 2.6 g (0.009 mol), was dissolved into 45 ml of methanol, to which an aqueous solution of 2.6 g (0.009 mol) of powdery KSbF$_6$ was added under stirring. Subsequently, the same procedures of Example 1 were repeated and product recrystallized to obtain 3.40 g (75.0% yield) of benzyl-4-methoxyphenylmethylsulfonium hexafluoroantimonate as white crystals.
Melting point 76.0°–79.0° C.
1 R (K Br) cm$^{-1}$ 660
NMR (Acetone-d $_6$) ppm
δ=3.45 (3H, S, CH$_3$—)
δ=3.90 (3K, S, CH$_3$O—)
δ=5.10 (2H, dd, J=16Hz, 12Hz, C$_6$H$_5$CH$_2$—)
δ=7.20 (2H, d, J=9Hz)
7.86 (2H, d, J=9Hz) or more (4H, —C$_6$H$_4$—)
δ=7.36 (5H, S, C$_6$H$_5$—)
Elementary Analysis: C$_{15}$H$_{17}$OSSPF$_6$
Theoretical Value: C; 37.46 %. H; 3.53%
Measured Value: C; 37.43 % H; 3.48%

EXAMPLE 8

Synthesis for benzyl-4-methoxyphenylmethylsulfonium hexafluorophosphate

Benzyl-4-methoxyphenylmethylsulfonium chloride, in an amount of 8.0 g (0.028 mol), was dissolved into 92 ml of methanol, to which an aqueous solution of 5.3 g (0,028 mol) of KPF$_6$ was added under stirring. Subsequently, the same procedures as those in Example 1 were repeated to obtain 7.8 g (70.0% yield) of benzyl-4-methoxyphenylmethylsulfonium hexafluorophosphate as white crystals.
Melting point 89.0°–91.0° C.
1 R (K Br) cm$^{-1}$ 840
NMR (Acetone-d $_6$) ppm
δ=3.40 (3H, S, CH$_3$—)
δ=3.87 (3H, S, CH$_3$O—)
δ=5.03 (2H, dd, J=16Hz, 12Hz, C$_6$H$_5$CH$_2$—)
7.78 (2H, d, J=9Hz) or more (4H, —C$_6$H$_4$—)
δ=7.28 (1H, S, C$_6$H$_5$—)
Elementary Analysis: C$_{15}$H$_{17}$OSPF$_6$
Theoretical Value: C; 46.17%. H; 4.36%
Measured Value: C; 45.97%. H; 4.39%

EXAMPLE 9

Synthesis for benzyl-3-chloro-4-hydroxyphenylmethylsulfonium hexafluoroantimonate Benzyl-3-chloro-4-hydroxyphenylmethylsulfonium chloride, in an amount of 1.0 g (0.003 mol), was dissolved into 100 ml of methanol, to which 1.0 g (0.003 mol) of powdery KSbF$_6$ was added under stirring. Subsequently, the same procedures as those in Example 1 were repeated to obtain 1.20 g (70.0% yield) of benzyl-3-chloro-4-hydroxyphenylmethylsulfonium hexafluoroantimonate as white crystals.
Melting point 161.0°–162.0° C.
1 R (K Br) cm$^{-1}$ 3460, 660
NMR (Acetone-d $_6$) ppm
δ=3.47 (1H, S, CH$_3$—)
δ=5.10 (2H, dd, J=15Hz, 13Hz, C$_6$H$_5$CH$_2$—)
δ=7.17–7.95 (8H, M, C$_6$H$_5$—, —C$_6$H$_3$Cl—)
Elementary Analysis: C$_{14}$H$_{14}$OSCe SbF$_6$
Theoretical Value: C; 36.05% H; 3.00%
Measured Value: C; 36.13%. H; 2.95%

EXAMPLE 10

Synthesis for benzyl-3-methyl-4-hydroxyphenylmethylsulfonium hexafluoroantimonate Benzyl-3-methyl-4-hydroxyphenylmethylsulfonium chloride, in an amount of 10 g (0.035 mol), was dissolved into 200 ml of methanol, to which 9.8 g (0,035 mol) of powdery KSbF$_6$ was added under stirring. Subsequently, the same procedures as those in Example 1 were repeated to obtain 14.8 g (87.0% yield) of benzyl-3-methyl-4-hydroxyphenylmethylsulfonium hexafluoroantimonate as white crystals.
Melting point 159.0°–161.0° C.
1 R (K Br) cm$^{-1}$ 3500, 660
NMR (Acetone-d $_6$) ppm
δ=2.27 (3H, S, C$_6$H$_3$CH$_3$—)
δ=3.42 (3H, S, CH$_3$—)
δ=5.03 (2H, dd, J=16Hz, 12Hz, C$_6$H$_5$CH$_2$—)
δ=6.98 7.67 (8H, m, C$_6$H$_5$—. —C$_6$H$_3$CH$_3$—)
δ=9.65 (1H, S, HO—)
Elementary Analysis: C$_{15}$H$_{17}$SSbF$_6$
Theoretical Value: C; 37.45%, H; 3.54%
Measured Value: C; 37.25%, H; 3.61%

EXAMPLE 11

Synthesis for 4-acetoxyphenylbenzylmethylsulfonium hexafluoroantimonate

Benzyl-4-hydroxyphenylmethylsulfonium hexafluoroantimonate synthesized in Example 1 was dissolved in an amount of 10.0 g (0,021 mol) into 50 ml of ethyl acetate, to which 2.2 g (0.021 mol) of triethylamine was added at a temperature of 10° C. or lower and then 1.7 g (0.021 mol) of acetyl chloride was added at that temperature. After stirring for 3 hours, water was added to the reaction solution, the ethyl acetate layer was washed with water and then dried. The ethylacetate layer was concentrated under a reduced pressure and re-crystallized to obtain 9.80.g (90.0% yield) of 4-acetoxyphenylbenzylmethyl-sulfonium hexafluoroantimonate as white crystals.
Melting point 115.0°–117.0° C.
1 R (K Br) cm$^{-1}$ 1760, 660
NMR (Acetone-d $_6$) ppm
δ=2.30 (3H, S, CH$_3$COO—)
δ=3.52 (3H, S, CH$_3$—)
δ=5.15 (2H, dd, J=10Hz, 12Hz, —C$_6$H$_5$CH$_2$—)
δ=7.35–8.05 (9H, m, C$_6$H$_5$—, —C$_6$H$_4$—)
Elementary Analysis: C$_{16}$H$_{17}$O$_2$SSbF$_6$
Theoretical Value: C; 37.76%. H; 3.34%
Measured Value: C; 38.00%. H; 3.38%

EXAMPLE 12

Synthesis for 4-acetoxyphenylbenzylmethylsulfonium hexafluorophosphate.

Benzyl-4-hydroxyphenylmethylsulfonium hexafluorophosphate synthesized in Example 2 was dissolved in an amount of 20 g (0.053 mol) into 100 ml of ethyl acetate, to which 5.4 g (0.053 mol) of triethylamine was added at a temperature of 10° C. or lower and then 4.2 g (0.053 mol) of acetyl chloride was dropped at that temperature. The procedure of Example 11 was then repeated to prepare 4-acetoxyphenylbenzylmethylsulfonium hexafluorophosphate which was obtained in an amount of 22.2 g (88.0% yield) as white crystals.

Melting point 96.0°–99.0° C.
1 R (K Br) cm$^{-1}$ 1760, 850
NMR (Acetone-d$_6$) ppm
$\delta$=2.30 (3H, S, CH$_3$ COO —)
$\delta$=3.52 (3H, S, CH$_3$ —)
$\delta$=5.14 (2H, dd, J=16Hz, 12Hz, C$_6$ H$_5$ CH$_2$ —)
$\delta$=7.35–8.05 (9H, m, C$_6$ H$_5$ —. —C$_6$ H$_4$ —)
Elementary Analysis: C$_{16}$H$_{17}$O$_2$SPF$_6$
Theoretical Value: C; 45.95% H; 4.06%
Measured Value: C; 45.62%, H; 4.29%

EXAMPLE 13

Synthesis for 4-acetoxyphenylbenzylmethylsulfonium tetrafluoroborate

Benzyl-4-hydroxyphenylmethylsulfonium tetrafluoroborate synthesized in Example 3 was dissolved in an amount of 20 g (0.057 mol) into 100 ml of acetonitrile, to which 5.8 g (0.057 mol) of triethylamine was added at a temperature of 10° C. or lower and then 4.5 g (0.057 mol) of acetyl chloride was added at that temperature. After stirring for 3 hours, the acetonitrile layer was concentrated under a reduced pressure and re-crystallized to obtain 13.4 g (60.0% yield) of 4-acetoxyphenylbenzylmethylsulfonium tetrafluroborate as white crystals.

Melting point 118.0°–120.0° C.
1 R (K Br) cm$^{-1}$ 1760, 1090
NMR (Acetone-d$_6$) ppm
$\delta$=2.30 (3H, S, CH$_3$ COO —)
$\delta$=3.48 (3H, S, CH$_3$ —)
$\delta$=5.13 (2H, dd, J=16Hz, 12Hz, C$_6$ H$_5$ CH$_2$ —)
$\delta$=7.32–8.04 (9H, m, C$_6$ H$_5$ —. —C$_6$ H$_4$ —)
Elementary Analysis: C$_{16}$H$_{17}$O$_2$SBF$_4$
Theoretical Value: C; 53.36%. H; 4.76%
Measured Value: C; 53.03%. H; 4.68%

EXAMPLE 14

Synthesis for Benzyl-4-methoxycarbonyloxyphenyl-sulfonium hexafluoroantimonate

Benzyl-4-hydroxyphenylmethylsulfonium hexafluoroantimonate synthesized in Example 1 was dissolved in an amount of 20 g (0.043 mol) into 200 ml of ethyl acetate, to which 4.4 g (0.043 mol) of triethylamine was added at a temperature of 10° C. or lower and then 4.1 g (0.043 mol) of methylchloroformate was added at that temperature. The procedure of Example 11 was then repeated to prepare benzyl-4-methoxycarbonyloxyphenylmethylsulfonium hexafluoroantimonate which was obtained in an amount of 21.3 g (95.0% yield) as white crystals.

Melting point 72.0°–75.0° C.
1 R (K Br) cm$^{-1}$ 1760, 660
NMR (Acetone-d$_6$) ppm
$\delta$=3.54 (3H, S, CH$_3$ —)
$\delta$=3.90 (3H, S, CH$_3$ O—)
$\delta$=5.15 (2H, dd, J=15Hz, 12Hz, C$_6$ H$_5$ CH$_2$ —)
$\delta$=7.34 (5H, m, C$_6$ H$_5$ —)
$\delta$=7.55 (2H, d, J=9Hz) 8.00 (2H, d, J=9Hz) or more (4H, —C$_6$ H$_4$ —)
Elementary Analysis: C$_{16}$H$_{17}$O$_3$SSbF$_6$
Theoretical Value: C; 36.61%, H; 3.24%
Measured Value: C; 36.65%, H; 3.26%

EXAMPLE 15

Synthesis for Benzyl-4-methoxycarbonyloxyphenylmethyl-sulfonium hexafluorophosphate Benzyl-4-hydroxyphenylmethylsulfonium hexafluorophosphate synthesized in Example 2 was dissolved in an amount of 40 g (0.1 mol) into 200 ml of ethyl acetate, to which 10.8g (0.1 mol) of triethylamine was added at a temperature of 10° C. or lower and then 10.1 g (0.1 mol) of methylchloroformate was added at that temperature. The procedure of Example 11 was then repeated to prepare benzyl-4-methoxycarbonyloxyphenylmethylsulfonium hexafluorophosphate which was obtained in an amount of 39.2 g (85.0% yield) as white crystals.

Melting point 76.0°–80.0° C.
1 R (K Br) cm$^{-1}$ 1760, 840
NMR (Acetone-d$_6$) ppm
$\delta$=3.46 (3H, S, CH$_3$ —)
$\delta$=3.84 (3H, S, CH$_3$ O—)
$\delta$=5.05 (2H, dd, J=15Hz, 12Hz, C$_6$ H$_5$ CH$_2$ —)
$\delta$=7.25 (5H, S, C$_6$ H$_5$ —)
$\delta$=7.43 (2H, d, J=9Hz)
7.89 (2H, d, J=9Hz) or more (4H, —C$_6$ H$_4$ —)
Elementary Analysis: C$_{16}$H$_{17}$O$_3$SPF$_6$
Theoretical Value: C; 44.26%, H; 3.92%
Measured Value: C; 44.00%, H; 4.00%

EXAMPLE 16

Synthesis for 4-methoxybenzyl-4-hydroxyphenylmethylsulfonium hexafluoroantimonate 4-methoxybenzyl-4-hydroxyphenylmethylsulfonium chloride, in an amount of 2 g (0.006 mol), was dissolved into 30 ml of methanol, to which 1.9 g (0.007 mol) of powdery KSbF$_6$ was added under stirring. The same procedures as those in Example 1 were repeated to obtain 2.70 g (80.0% yield) of 4-methoxybenzyl-4-hydroxyphenylmethylsulfonium hexafluoroantimonate as white crystals.

Melting point 86.00°–88.0° C.
1 R (K Br) cm$^{-1}$ 3450, 660
NMR (Acetone-d$_6$) ppm
$\delta$=3.37 (3H, S, CH$_3$ —)
$\delta$=3.77 (3H, S, CH$_3$ O—)
$\delta$=4.96 (2H, dd, J=15Hz, 12Hz, —C$_6$ H$_4$ CH$_2$ —)
$\delta$=6.68–7.80 (8H, m, 2x-C$_6$ H$_4$ —)
Elementary Analysis: C$_{15}$H$_{17}$OSSbF$_6$
Theoretical Value: C; 36.29% H; 3.48%
Measured Value: C; 36.00%, H; 3.25%

COMPARATIVE EXAMPLES

COMPARATIVE EXAMPLE 1

Benzyl-4-hydroxyphenylmethylsulfonium hexafluoroantimonate was synthesized in the same procedures as in Example 1 except for using water instead of methanol. The yield was 19.3 g (41.5% yield).

COMPARATIVE EXAMPLE 2

4-acetoxyphenylbenzylmethylsulfonium hexafluoroantimonate was synthesized in the same procedures as in Example 11 except for using methanol instead of ethyl acetate as the reaction solvent. The yield was 1.31 g (12.0% yield).

POLYMERIZATION REACTIONS USING POLYFLUOROSULFONIUM COMPOUNDS

WORKING EXAMPLE 1

Benzyl-4-hydroxyphenylmethylsulfonium hexafluoroantimonate synthesized in Example 1, in an amount of 6.2 mg was mixed with 1.0 g of phenylglycidyl ether. The mixture was deaerated and subjected to bulk polymerization in a sealed tube at 100° C., to determine a relationship between the conversion ratio and the time. The conversion ratio was determined based on $^1$H-NMR spectrum. The result is shown in FIG. 3.

WORKING EXAMPLE 2

Figure 4:
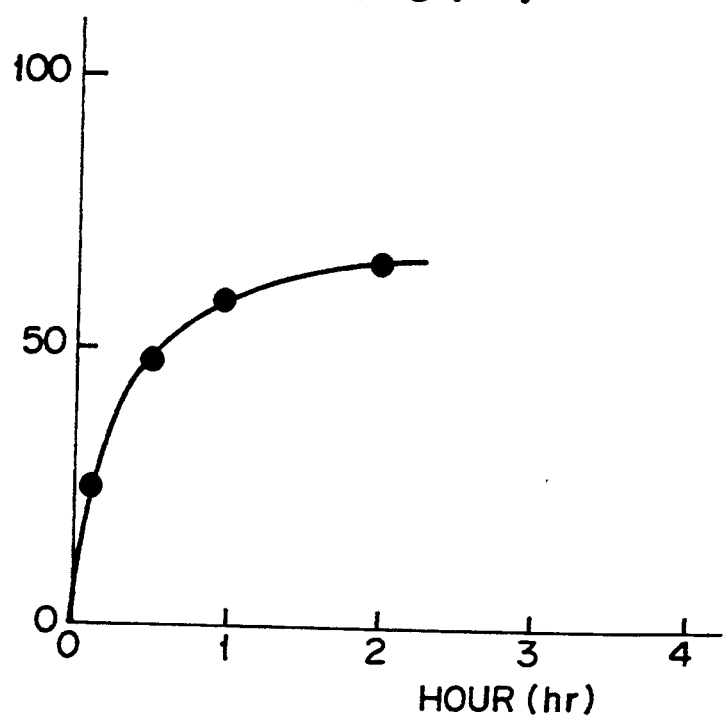
FIG. 4 is a graph illustrating the conversion ratio in photopolymerization in Working Example 2, in each of which the ordinate represents the polymerization degree.

Benzyl-4-hydroxyphenylmethylsulfonium hexafluoroantimonate synthesized in Example 1, in an amount of 15.7 mg was mixed with 0.5 g of phenylglycidyl ether, deaerated and sealed in a tube. Photo-induced bulk polymerization was conducted at 20° C. by using a 400 watt (W) high pressure mercury lamp having main wavelength at 312 nm as a light source and using a rotary photochemical reactor (RH400-10W type, manufactured by Rico Kagaku Sangyo Co.), to determine a relationship between the conversions ratio and the time. The result is shown in FIG. 4.

WORKING EXAMPLE 3

Benzyl-4-hydroxyphenylmethylsulfonium hexafluoroantimonate synthesized in Example 1 was dissolved in an amount of 1 g into 100 g of Epikote 828 (bisphenol-A epoxy resin, manufactured by Yuka Shell Epoxy Co.), which was coated to a thickness of 0.5 mm on a glass plate. Then, it was irradiated by a ultra-violet lamp (80 W/cm, high pressure mercury lamp) at a distance of 10 cm for 2 min. After irradiation, the resin was completely gelled.

WORKING EXAMPLE 4

When the mixture of Working Example 3 was irradiated by a ultra-violet ray lamp for one min, the viscosity was increased. When it was further treated at 120° C. for 5 min, a glass-like curing product was obtained. When the mixture prepared in Working Example 3 was left at room temperature for one month, no viscosity increase was observed.

WORKING EXAMPLE 5

Benzyl-4-methoxyphenylmethylsulfonium hexafluoroantimonate synthesized in Example 7 was mixed by 1 mol% to 1.0 g of phenylglycidyl ether. The mixture was deaerated, sealed in a tube and subjected to bulk polymerization at 60° C. and 100° C. for one hour respectively, to determine an epoxy conversion ratio by using 1H-NMR spectrum. The result was 7% at 60° C. and 62% at 100° C.

WORKING EXAMPLES 6-10

Phenylglycidyl ether was polymerized by using various benzyl sulfonium salts according to Working Example 5. The results are shown in Table 1. Further, when the thus prepared compositions were left at room temperature for one month, no remarkable increase in the viscosity was observed except for the composition prepared in Working Example 8. When the composition prepared in Working Example 8 was left at 10° C. for one month, no further remarkable increase of viscosity was observed. Comparative Examples 1 and 2 represent products synthesized on the basis of the prior art.

WORKING EXAMPLES 11-14

Various benzyl sulfonium salts were mixed each by 1 mol % to 1.0 g of phenylglycidyl ether. The mixture was deaerated, sealed in a tube and subjected to photo-induced bulk polymerization at 20° C. for 90 min to determine a conversion ratio from $^1$H-NMR spectrum. A 400 W high pressure mercury lamp was used as a light source and rotary photochemical reactor manufactured by Riko Kagaku Sangyo was used. The temperature for the polymerization was 20° C. The results are shown in Table 2. Comparative Examples 1 and 2 represent products synthesized on the basis of the prior art.

WORKING EXAMPLE 15

Blends comprising 100 parts by weight of Celloxide 2021 (cycloaliphatic epoxy resin, manufactured by DAICEL CHEMICAL INDUSTRIES, LTD) and each one part by weight of various benzyl sulfonium salts were prepared and each of them was taken in an amount of about 100 mg and gelling time was measured on a hot plate (gelling tester: GT-D-JIS type, manufactured by Nisshin Kagaku Co.) heated to 100° C. The results are shown in Table 3. Comparative Examples represent products synthesized on the basis of the prior art.

WORKING EXAMPLE 16

Benzyl-4-hydroxyphenylmethylsulfonium hexafluoroantimonate synthesized in Example 1 was mixed by 3 mol % to 0.5 g of 1-phenyl-4-ethyl-2,6,7-trioxabicyclo(2,2,2)octane, deaerated and sealed in a tube. The mixture was subjected to bulk polymerization at 100° C. for 24 hours. After the polymerization, the conversion ratio was confirmed to be 100% from $^1$H-NMR spectrum. Then, the polymer was dissolved in 2 ml of methylene chloride and poured into 100 ml of hexane. The hexane insoluble portion was then dried to obtain 0.36 g of polymer.

WORKING EXAMPLE 17

Benzyl-4-hydroxyphenylmethylsulfonium hexafluoroantimonate synthesized in Example 1 was mixed by 3 mol % to 0.5 g of 3,9-dibenzyl-1,5,7,11-tetraoxaspiro(5,5)undecane, deaerated and sealed in a tube. The mixture was subjected to bulk polymerization at 120° C. for 2 hours. After the polymerization, the conversion ratio was confirmed to be 95% from $^1$H-NMR spectrum. The polymer was then dissolved in 2 ml of methylene chloride and poured into 100 ml of hexane. The hexane insoluble portion was dried to obtain 0.45 g of polymer.

WORKING EXAMPLE 18

Benzyl-4-hydroxyphenylmethylsulfonium hexafluoroantimonate synthesized in Example 1 was mixed by 1 mol % to 0.5 g of purified styrene, deaerated and sealed in a tube. Then, polymerization took place under stirring at 80° C. After 60 min, the solidified reaction products was dissolved in 2 ml of carbon tetrachloride and the conversion ratio was confirmed to be 95% from $^1$H-NMR spectrum.

The product was then poured into methanol to stop the-polymerization and deposit the polymer. The purified and dried polymer was white crystals and the yield was 82%.

Further, based gel-permeation chromatography (GPC) (converted as polystyrene), $\overline{Mn}=4000$, $\overline{Mw}/\overline{Mn}=1.95$. $\overline{Mn}$ means the number average molecular weight and $\overline{Mw}$ means weight average molecular weight.

WORKING EXAMPLES 19-24

Styrone was polymerized by using various benzyl sulfonium salts according to Working Example 18. The results are shown in Table 4.

WORKING EXAMPLE 25

Styrene was polymerized at 50° C. for 60 min according to Working Example 18, but the conversion ratio was 0%. See page 12 of the disclosure.

WORKING EXAMPLE 26

Polymerization was conducted quite in the same manner as in Working Example 18 except for using 0.5 g of n-butyl vinyl ether instead of 0.5 g of styrene, to obtain a polymer of n-butyl vinyl ether. Conversion ratio:87%, yield: 73%, $\overline{Mn}=5600$, $\overline{Mw}/\overline{Mn}=1.60$

WORKING EXAMPLE 27

Under the same conditions as in Working Example 18, solution polymerization was taken place by using 2 ml chlorobenzene as a solvent, to obtain polystyrene. Conversion ratio 99%, yield: 87%, $\overline{Mn}=5200$, $\overline{Mw}/\overline{Mn}=1.70$.

WORKING EXAMPLE 28

10 g of purified styrene and 5 mol % of benzyl-4-hydroxyphenylmethylsulfonium hexafluoroantimonate synthesized in Example 1 were dissolved in 20 ml of chlorobenzene, deaerated and sealed in a tube. When they were left at a room temperature for one month, polymerization of styrene did not occur. See page 12 of the disclosure.

WORKING EXAMPLES 29-35

Compositions comprising each 100 parts by weight Epikote 828 (bisphenol-A epoxy resin, manufactured by Yuka Shell Epoxy) and 3 parts by weight of various benzyl sulfonium salts were prepared. Then, each of the compositions was charged in a glass bottle and heated in an oil bath to conduct a curing test at 150° and measure the time required for the curing. The results are shown Table 5. Comparative Examples represent products synthesized on the basis of the prior art.

WORKING EXAMPLE 36

When the compositions prepared in Working Examples 29-35 were left at 40° for one month, no remarkable increase for the viscosity was observed except for the composition in Working Example 31. Further, when the composition of Working Example 31 was left at 10° C. for one month, no remarkable viscosity increase was observed.

TABLE 1

| Working Example | Benzyl sulfonium salt | Conversion ratio (%) 60° C. | Conversion ratio (%) 100° C. |
| --- | --- | --- | --- |
| 6 | HO—C$_6$H$_4$—S$^+$(CH$_2$—C$_6$H$_5$)(CH$_3$) · SbF$_6^-$ | 2 | 70 |
| 7 | HO—C$_6$H$_4$—S$^+$(CH$_2$—C$_6$H$_5$)(CH$_3$) · PF$_6^-$ | 3 | 41 |
| 8 | CH$_3$CO(O)—C$_6$H$_4$—S$^+$(CH$_2$—C$_6$H$_5$)(CH$_3$) · SbF$_6^-$ | 45 | 76 |
| 9 | HO—C$_6$H$_2$(CH$_3$)(tBu)—S$_+$(CH$_2$—C$_6$H$_5$)(CH$_3$) · AsF$_6^-$ | 2 | 67 |

TABLE 1-continued

| Working Example | Benzyl sulfonium salt | Conversion ratio (%) 60° C. | 100° C. |
|---|---|---|---|
| 10 | HO–C₆H₄–S⁺(CH(C₂H₅)CH₂–C₆H₅) · SbF₆⁻ | 0 | 68 |
| Comparative Example 1 | (tetrahydrothiophene)S⁺–CH₂–C₆H₅ · SbF₆⁻ | 1 | 4 |
| Comparative Example 2 | HO–C₆H₄–S⁺(CH₂–C₆H₅)₂ · SbF₆⁻ | 0 | 0 |

TABLE 2

| Working Example | Benzyl sulfonium salt | Conversion ratio (%) |
|---|---|---|
| 11 | HO–C₆H₄–S⁺(CH(CH₃)CH₂–C₆H₅) · SbF₆⁻ | 65 |
| 12 | HO–C₆H₄–S⁺(CH(CH₃)CH₂–C₆H₄–OCH₃) · PF₆⁻ | 63 |
| 13 | CH₃C(O)O–C₆H₄–S⁺(CH(CH₃)CH₂–C₆H₅) · SbF₆⁻ | 49 |
| 14 | HO–C₆H₄–S⁺(CH(C₂H₅)CH₂–C₆H₅) · SbF₆⁻ | 72 |
| Comparative Example 1 | (C₆H₅)₃S⁺ · SbF₆⁻ | 59 |
| Comparative Example 2 | (tetrahydrothiophene)S⁺–CH₂–C₆H₅ · SbF₆⁻ | 0 |

TABLE 3

| No. | Benzyl sulfonium salt (Working Example 15) | Gelling time |
|---|---|---|
| 1 | HO–C₆H₄–S⁺(–CH(CH₃)–CH₂–C₆H₅) · SbF₆⁻ | 1 min, 48 sec |
| 2 | CH₃C(O)O–C₆H₄–S⁺(–CH(CH₃)–CH₂–C₆H₅) · SbF₆⁻ | 34 sec |
| 3 | CH₃O–C₆H₄–S⁺(–CH(CH₃)–CH₂–C₆H₅) SbF₆⁻ | 1 min |
| 4 | CH₃OC(O)O–C₆H₄–S⁺(–CH(CH₃)–CH₂–C₆H₅) · PF₆⁻ | 58 sec |
| Comparative Example 1 | (tetrahydrothiophenium)–CH₂–C₆H₅ · SbF₆⁻ | 20 min or more |
| Comparative Example 2 | HO–C₆H₄–S⁺(–CH₂–C₆H₅)(–CH₂–C₆H₅) · SbF₆⁻ | 60 min or more |
| Comparative Example 3 | (C₆H₅)₃S⁺ · SbF₆⁻ | 60 min or more |

TABLE 4

| Working Example | Sulfonium salt | Conversion ratio (%) | Yield (%) | $\overline{Mn}$ | $\overline{Mw}/\overline{Mn}$ |
|---|---|---|---|---|---|
| 19 | CH₃O–C₆H₄–S⁺(–CH(CH₃)–CH₂–C₆H₅) SbF₆⁻ | 94 | 82 | 3900 | 2.00 |
| 20 | CH₃C(O)O–C₆H₄–S⁺(–CH(CH₃)–CH₂–C₆H₅) · PF₆⁻ | 99 | 82 | 4000 | 1.80 |

TABLE 4-continued

| Working Example | Sulfonium salt | Conversion ratio (%) | Yield (%) | $\overline{Mn}$ | $\overline{Mw}/\overline{Mn}$ |
|---|---|---|---|---|---|
| 21 | 3-tBu-5-CH₃-4-HO-C₆H₂–S⁺(CH(CH₃)CH₂C₆H₅) · AsF₆⁻ | 85 | 75 | 5500 | 1.77 |
| 22 | CH₃OC(O)O-C₆H₄–S⁺(CH(CH₃)CH₂C₆H₅) · PF₆⁻ | 99 | 85 | 4200 | 1.97 |
| 23 | HO-C₆H₄–S⁺(CH(CH₃)CH₂C₆H₅) · BF₄⁻ | 75 | 60 | 7000 | 1.70 |
| 24 | 3-Cl-4-HO-5-tBu-C₆H₂–S⁺(CH(CH₃)CH₂C₆H₅) · SbF₆⁻ | 98 | 85 | 4100 | 1.35 |

TABLE 5

| Working Example | Aromatic sulfonium compound | Curing time |
|---|---|---|
| 29 | HO-C₆H₄–S⁺(CH(CH₃)CH₂C₆H₅) · SbF₆⁻ | 1 min, 20 sec |
| 30 | HO-C₆H₄–S⁺(CH(CH₃)CH₂C₆H₅) · PF₆⁻ | 3 min, 33 sec |
| 31 | CH₃C(O)O-C₆H₄–S⁺(CH(CH₃)CH₂C₆H₅) · SbF₆⁻ | 45 sec |
| 32 | CH₃O-C₆H₄–S⁺(CH(CH₃)CH₂C₆H₅) · SbF₆⁻ | 54 sec |
| 33 | 3-CH₃-4-HO-C₆H₃–S⁺(CH(C₂H₅)CH₂C₆H₅) · SbF₆⁻ | 2 min, 24 sec |

TABLE 5-continued

| Working Example | Aromatic sulfonium compound | Curing time |
|---|---|---|
| 34 | 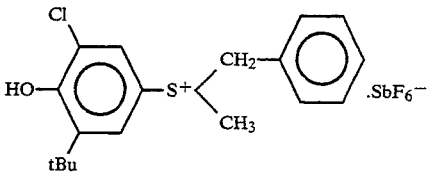 | 1 min, 5 sec |
| 35 | 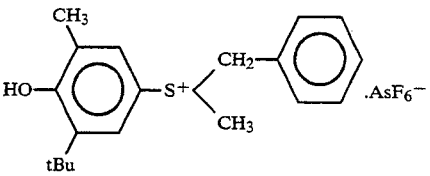 | 55 sec |
| Comparative Example 1 | 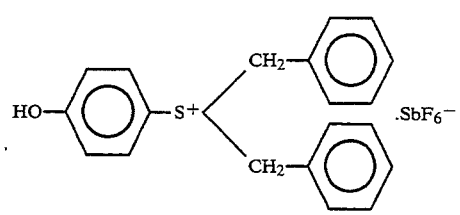 | >30 min |
| Comparative Example 2 | 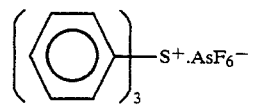 | >60 min |

As apparent from the Synthetic Examples and Working Examples described above, the novel polyfluorosulfonium compounds according to the present invention are effective as an epoxy curing catalyst requiring high purity and, further, as an industrial intermediate material. Further, with the process for producing the sulfonium compound according to the present invention, the novel sulfonium compounds can be produced by simple procedures, at high yield, effectively and economically.

Further, the specified benzyl sulfonium salt according to the present invention is useful as the polymerization initiator for cationically polymerizable material, and the polymer composition containing the same can be polymerized and cured by the polymerization process based on the irradiation of radiation rays such as light and electron rays and/or by heat treatment. Furthermore, the composition formulated into a one component system is stable even after mixing which has excellent storeability at room temperature.

The invention being thus described, it will be obvious that the same may be varied in many ways. Such variations are not to be regarded as a departure from the spirit and scope of the invention and all such modifications are intended to be included within the scope of the claims.

What is claimed is:

1. A polymerizable composition, said composition comprising a cationically polymerizable material and a thermal polymerization initiator comprising a benzyl sulfonium salt represented by the general formula (I):

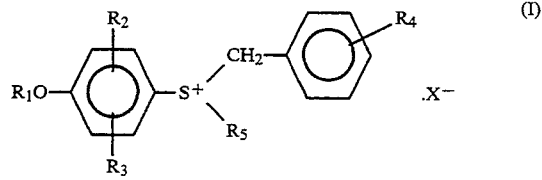

where $R_1$ represents a member selected from the group consisting of hydrogen, a methyl group, an acetyl group and a methoxycarbonyl group; $R_2$ and $R_3$ each represent a member selected from the group consisting of hydrogen and an alkyl group having 1 to 4 carbon atoms; $R_4$ represents a member selected from the group consisting of hydrogen and a methyl group; $R_5$ represents an alkyl group having 1 to 4 carbon atoms; and $X^-$ represents an anion° selected from the group consisting of $SbF_6$ and $PF_6$.

2. A polymerizable composition as defined in claim 1, wherein said cationically polymerizable material is a compound comprising an expoxy group.

3. A polymerizable composition as defined in claim 1, wherein the cationically polymerizable material is a cationically polymerizable vinyl compound.

4. A polymerizable composition as defined in claim 1, wherein the cationically polymerizable material is a compound having one or more of spiro-orthoester group, bicyclo-ortho ester group and spiro-orthocarbonate group.

5. A polymerizable composition as defined in claim 1, comprising from about 0.01 to about 20 parts by weight of said benzyl sulfonium salt represented by general formula (I) to 100 parts by weight of the cationically polymerizable material.

6. A polymerizable composition of claim 1 wherein said sulfonium salt is benzyl-4-hydroxyphenylmethylsulfonium hexafluoroantimonate.

7. A polymerizable composition of claim 1 wherein said sulfonium salt is benzyl-4-acetoxyphenylmethylsulfonium hexafluoroantimonate.

8. A polymerizable composition of claim 1 wherein said sulfonium salt is benzyl-4-methoxycarbonyloxyphenylmethylsulfonium hexafluoroantimonate.

9. A process for polymerizing cationically polymerizable material, said process for polymerizing comprising
A) adding a thermal polymerization initiator comprising at least one benzyl sulfonium salt represented by the general formula (I)

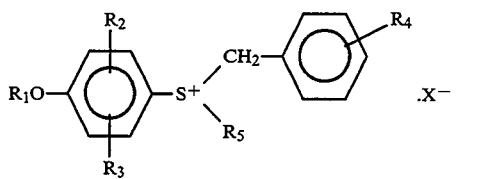

where $R_1$ represents a member selected from the group consisting of hydrogen, a methyl group, an acetyl group and a methoxycarbonyl group; $R_2$ and $R_3$ each represent a member selected from the group consisting of hydrogen and an alkyl group having 1 to 4 carbon atoms; $R_4$ represents a member selected from the group consisting of hydrogen and a methyl group; $R_5$ represents an alkyl group having 1 to 4 carbon atoms; and $X^-$ represents an anion selected from the group consisting of $SbF_6$ and $PF_6$ to a cationically polymerizable material, and B) exposing said cationically polymerizable material and said thermal polymerization initiator to heat to initiate a polymerization reaction.

10. The polymerization process of claim 9, wherein said cationically polymerizable material and said thermal polymerization initiator are further exposed to radiation rays comprising ultraviolet rays.

11. The polymerization process of claim 9, wherein the polymerization is conducted at a temperature of 20° C. or higher and the polymerizable material is a vinyl compound.

12. The polymerization process of claim 9, wherein from about 0.01 to about 20 parts by weight of said benzyl sulfonium salt represented by the general formula (I) is added to 100 parts by weight of cationically polymerizable material.

* * * * *

UNITED STATES PATENT AND TRADEMARK OFFICE
CERTIFICATE OF CORRECTION

PATENT NO. : 5,399,596
DATED : March 21, 1995
INVENTOR(S) : K. KOUGE et al.

Page 1 of 2

It is certified that error appears in the above-indentified patent and that said Letters Patent is hereby corrected as shown below:

At column 3, line 50, change "R4represents" to ---R4 represents---.
At column 4, line 57, change ".group;" to ---group;---.
At column 9, line 10, change "(Acetone-d 6) ppm" to ---NMR (Acetone-d $_6$) ppm---.
At column 9, line 41, change "8=" to ---$\delta$=---.
At column 9, line 44, change "4.04" to ---4.04%---.
At column 11, line 4, change "s," to ---S,---.
At column 11, between lines 52 and 53, insert the following new line ---$\delta$= 7.14 (2H, d, J=9Hz)---.
At column 12, line 21, change "(0,035" to ---(0.035---.
At column 13, line 8, change "(0,053" to ---(0.053---.
At column 17, line 12, change "the-polymerization" to ---the polymerization---.
At column 17, line 36, change "1.60" to ---1.60.---.
At columns 21 and 22, Table 4, row 1, column 2, change "SbF$_6$-" to ---.SbF$_6$- ---.

UNITED STATES PATENT AND TRADEMARK OFFICE
CERTIFICATE OF CORRECTION

PATENT NO. : 5,399,596
DATED : March 21, 1995
INVENTOR(S) : K. KOUGE et al.

It is certified that error appears in the above-indentified patent and that said Letters Patent is hereby corrected as shown below:

At columns 23 and 24, Table 5, row 4, column 2, change "$SbF_6^-$" to ---.$SbF_6^-$---.

Signed and Sealed this

Twenty-second Day of October, 1996

Attest:

BRUCE LEHMAN

Attesting Officer        Commissioner of Patents and Trademarks